(12) United States Patent
Steffler

(10) Patent No.: US 8,089,807 B1
(45) Date of Patent: Jan. 3, 2012

(54) METHOD AND SYSTEM FOR DATA STORAGE

(75) Inventor: Joseph Bernard Steffler, Grand Rapids, MI (US)

(73) Assignee: GE Aviation Systems, LLC, Grand Rapids, MI (US)

( * ) Notice: Subject to any disclaimer, the term of this patent is extended or adjusted under 35 U.S.C. 154(b) by 0 days.

(21) Appl. No.: 12/951,360

(22) Filed: Nov. 22, 2010

(51) Int. Cl.
*G11C 11/34* (2006.01)

(52) U.S. Cl. ............... 365/185.03; 365/185.22

(58) Field of Classification Search ............ 365/185.03, 365/185.22
See application file for complete search history.

(56) References Cited

U.S. PATENT DOCUMENTS

| | | | |
|---|---|---|---|
| 7,818,610 B2 | 10/2010 | Rogers et al. | |
| 7,990,765 B2 * | 8/2011 | Park et al. | 365/185.03 |
| 2009/0327590 A1 | 12/2009 | Moshayedi | |
| 2009/0327591 A1 | 12/2009 | Moshayedi | |
| 2010/0250057 A1 | 9/2010 | Steffler | |
| 2010/0250058 A1 | 9/2010 | Steffler | |
| 2010/0250881 A1 | 9/2010 | Steffler | |

* cited by examiner

*Primary Examiner* — Jason Lappas
(74) *Attorney, Agent, or Firm* — David J. Clement, Esq.; Armstrong Teasdale LLP

(57) ABSTRACT

A method and system for a Crash Protected Memory (CPM) system are provided. The system includes a Multi-Level Cell (MLC) memory module including a first memory portion and a processor communicatively coupled to the MLC memory module. The processor is programmed to write in the first memory portion a first digital value into a first level of each data-storing cell in the first memory portion and to write a second digital value into a second level of each data-storing cell wherein the first and second digital values are the same. The processor is further programmed to read a digital value from each level of each data-storing cell in the first memory portion and determine a single digital cell value for each data-storing cell.

20 Claims, 1 Drawing Sheet

METHOD AND SYSTEM FOR DATA STORAGE

BACKGROUND OF THE INVENTION

The field of the invention relates generally to crash protected memories, and more specifically, to a system and method for storing and managing data storage in a Crash Protected Memory.

At least some known solid-state Crash Protected Memory (CPM) devices utilize Single-Level Cell (SLC) flash memory technology due to its higher reliability and wider design and operating margins. SLC technology also has an advantage in write/erase endurance. Where SLC technology stores a single binary state (0 or 1), Multi-Level Cell (MLC) technology can store two bits in four binary states in each cell (00, 01, 10, 11) To date, MLC technology cannot retain its data over the simulated low-temperature burn profile defined for aircraft crash recorders (260 degrees C. for 10 hours). This is due to charge leakage where the original programmed data is altered, for example, a cell value stored as a binary "11" may leak to "10" and a cell value stored as a binary "00" may leak to a "01".

Currently, SLC technology can withstand the leakage of some of the charge (or lack thereof) that indicates a binary 0 or 1 due to the design margin employed within the device. In other words, each cell of a SLC device is read to determine whether it contains a charge or is depleted (erased). The margin between the two states is wide enough to tolerate a significant amount of leakage over time and temperature while still preserving the data contained therein. However, SLC devices are becoming more scarce and expensive as they are smaller percentage of the global flash memory market due to the pressures of ever-increasing demand for storage capacity

BRIEF DESCRIPTION OF THE INVENTION

In one embodiment, a Crash Protected Memory (CPM) system includes a Multi-Level Cell (MLC) memory module including a first memory portion and a processor communicatively coupled to the MLC memory module. The processor is programmed to write in the first memory portion a first digital value into a first level of each data-storing cell in the first memory portion and to write a second digital value into a second level of each data-storing cell wherein the first and second digital values are the same. The processor is further programmed to read a digital value from each level of each data-storing cell in the first memory portion and determine a single digital cell value for each data-storing cell.

In another embodiment, a method of managing data in a Crash Protected Memory (CPM) system includes writing using a processor a first digital value into a first level of each data-storing cell in a first memory portion of a Multi-Level Cell (MLC) memory module, writing using the processor a second digital value into a second level of each data-storing cell in the first memory portion wherein the first and second digital values are the same, and reading a digital value from each level of each data-storing cell in the first memory portion. The method further includes determining a single digital cell value for each data-storing cell based on the read digital values from each level of a respective data-storing cell, and outputting the determined value.

In yet another embodiment, a non-transient computer-readable medium encoded with a program configured to instruct one or more computers to write in a first memory portion of a Multi-Level Cell (MLC) memory module a first digital value into a first level of each data-storing cell in the first memory portion, write a second digital value into a second level of each data-storing cell wherein the first and second digital values are the same, and read a digital value from each level of each data-storing cell in the first memory portion and determine a single digital cell value for each data-storing cell based on the first and second digital values.

BRIEF DESCRIPTION OF THE DRAWINGS

FIG. 1 is a schematic block diagram of a Crash Protected Memory (CPM) system in accordance with an exemplary embodiment of the present invention.

DETAILED DESCRIPTION OF THE INVENTION

Figure 1:
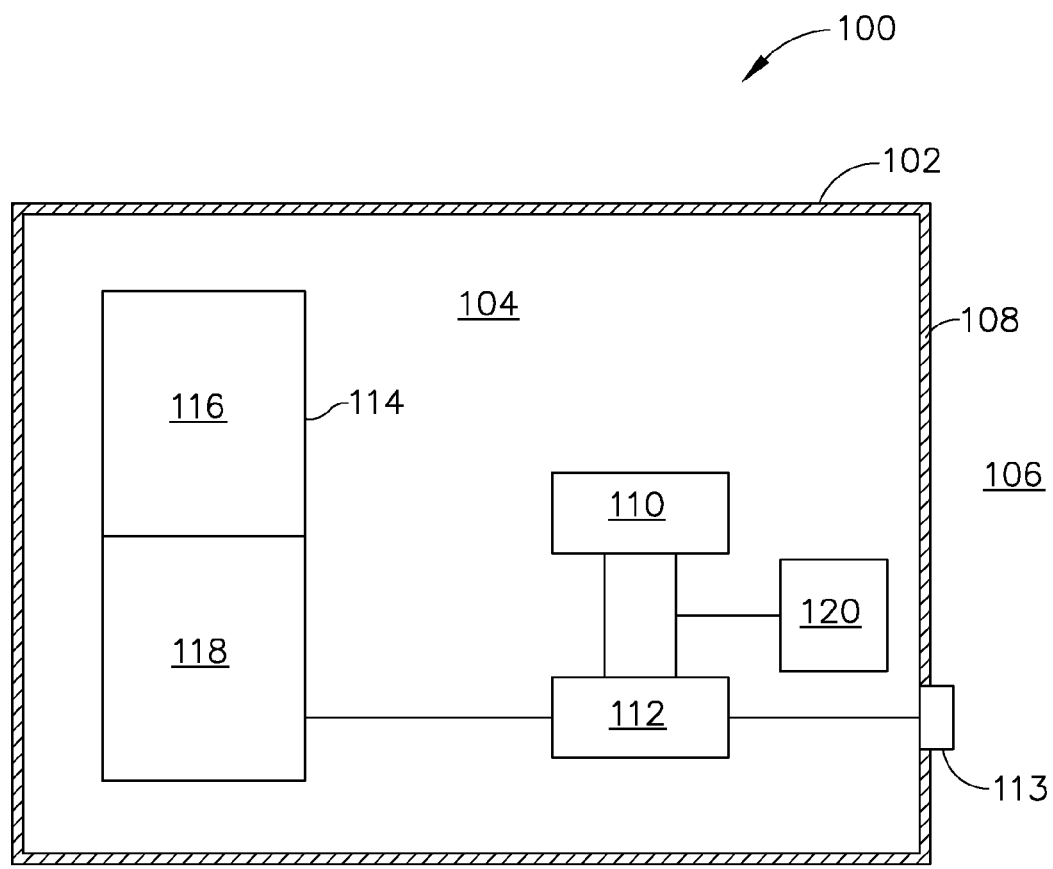
FIG. 1 shows an exemplary embodiment of the method and system described herein.

The following detailed description illustrates embodiments of the invention by way of example and not by way of limitation. It is contemplated that the invention has general application to analytical and methodical embodiments of storing data in industrial, commercial, and residential applications.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

FIG. 1 is a schematic block diagram of a Crash Protected Memory (CPM) system 100 in accordance with an exemplary embodiment of the present invention. In the exemplary embodiment, CPM system 100 includes a housing 102 including an internal volume 104 that is sealable from an ambient space 106 outside housing 102. Housing 102 also includes an insulation system 108 that protects internal volume 104 from environmental hazards in ambient space 106 that may damage components positioned within internal volume 104. Such hazards may include, but are not limited to, fire, submersion in salt or fresh water, shock, and impact.

CPM system 100 includes a data recording device 110 configured to receive data including, but not limited to, audio, video, radio traffic, and sensor signals from, for example, vibration, speed, altitude, engine operating parameters, operating parameters from one or more systems of a vehicle. CPM system 100 includes a processor 112 communicatively coupled to data recording device and to a Multi-Level Cell (MLC) memory module 114. Processor 112 may be positioned within CPM system 100 as illustrated or may be a separate processor that is used to read MLC memory module 114 such as after an incident during an investigation. A separate processor may be communicatively coupled to CPM system 100 using a feed through connector 113 or MLC memory module 114 may be removed from CPM system 100 and positioned within a device for reading MLC memory module 114. As used herein, MLC describes a memory that includes more then one bit of information per memory cell.

The value of each level of each data-storing cell is determined by for example, but not limited to, an electrical charge in the respective cell and a magnetic alignment in the respective cell. MLC memory module 114 includes a plurality of individually addressable cells for storing data. In the exemplary embodiment, MLC memory module 114 stores more than one bit of data in each cell, for example, but not limited to, two bits of data. For example, each cell is able to store data represented digitally as a "00", "01", "10", or "11" combinations. Each level of each cell is also individually addressable by processor 112. MLC memory module 114 may be portioned or divided into a first portion 116 and a second portion 118. First portion 116 may be used as a MLC memory module for non-critical data and/or data that is not required to be stored by a regulatory agency. The relative size of first portion 116 and second portion 118 are adjustable dynamically to accommodate various storage needs of CPM system 100. Second portion 118 utilizes a single level cell-like method in MLC memory module 114, which can be extended for use on MLC devices using three or more bits per cell. Instead of writing a binary value of 00, 01, 10 or 11 to a cell, as is typical for MLC devices, MLC memory module 114 is programmed with either 00 or 11 (0 or 3) in each cell that stores data in second portion 118. Therefore, the charge leakage effects of time and temperature will have less effect on the data when read using the following rules:

00 or 01 are to be read as 0,
  10 or 11 are to be read as 1.

This method restores much of the design margin available to SLC devices, at the expense of storage capacity.

CPM system 100 also includes a power supply 120 positioned within internal volume 104. Power supply 120 is configured to supply power to CPM system 100 for a period of time after a loss of power from offboard CPM system 100. In one embodiment, power supply 120 is configured to supply electrical power to CPM system 100 for a period of at least twenty minutes after a loss of power supplied by the vehicle.

The term processor, as used herein, refers to central processing units, microprocessors, microcontrollers, reduced instruction set circuits (RISC), application specific integrated circuits (ASIC), logic circuits, and any other circuit or processor capable of executing the functions described herein.

As used herein, the terms "software" and "firmware" are interchangeable, and include any computer program stored in memory for execution by processor 112, including RAM memory, ROM memory, EPROM memory, EEPROM memory, and non-volatile RAM (NVRAM) memory. The above memory types are exemplary only, and are thus not limiting as to the types of memory usable for storage of a computer program.

As will be appreciated based on the foregoing specification, the above-described embodiments of the disclosure may be implemented using computer programming or engineering techniques including computer software, firmware, hardware or any combination or subset thereof, wherein the technical effect is for storing data in a memory designed for high density using a method that improves on the charge leakage effects of the storage cells such that time and temperature have a lesser effect on the data when read. Any such resulting program, having computer-readable code means, may be embodied or provided within one or more computer-readable media, thereby making a computer program product, i.e., an article of manufacture, according to the discussed embodiments of the disclosure. The computer readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

The above-described embodiments of a method and system for storing data enable the use of MLC devices within a Crash Protected Memory (CPM) design. SLC devices are becoming a smaller percentage of the global flash memory market due to the pressures of ever-increasing demand for storage capacity. Therefore, they are becoming more scarce and expensive. Using MLC memory module 114 enables CPM system 100 to store non-mandatory crash data at a higher (raw) capacity by not employing the 00/11 storage method. In other words, more non-critical data can be stored at the MLC's raw capacity, but without the benefit of better protection from the effects of charge leakage.

The MLC technology provides a cost-effective and reliable means for providing lower CPM costs while increasing CPM storage capacity. More specifically, the methods and systems described herein facilitate storing critical data in a manner that improves time and temperature performance of the MLC memory while allowing non-critical data to be stored at higher densities. As a result, the method and system described herein facilitate storage of data in a cost-effective and reliable manner.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A Crash Protected Memory (CPM) system comprising:
   a Multi-Level Cell (MLC) memory module comprising a first memory portion; and
   a processor communicatively coupled to said MLC memory module, said processor programmed to write in the first memory portion a first digital value into a first level of each data-storing cell in the first memory portion and to write a second digital value into a second level of each data-storing cell wherein the first and second digital values are the same, said processor programmed to read a digital value from each level of each data-storing cell in the first memory portion and determine a single digital cell value for each data-storing cell.

2. A system in accordance with claim 1, wherein the value of each level of each data-storing cell is determined by an electrical charge in the respective cell.

3. A system in accordance with claim 1, wherein the value of each level of each data-storing cell is determined by a magnetic alignment in the respective cell.

4. A system in accordance with claim 1, wherein said MLC memory module comprises a second memory portion and wherein said processor is further programmed to write in the second memory portion a first digital value into a first level of each data-storing cell in the first memory portion and to write a second digital value into a second level of each data-storing cell wherein the first and second digital values are independent of each other, said processor programmed to read a digital value from each level of each data-storing cell in the first memory portion.

5. A system in accordance with claim 1, wherein said processor is programmed to determine a single cell value of each data-storing cell in the first memory portion that is the same as the digital value of the first and second level when the digital values are the same.

6. A system in accordance with claim 1, wherein said processor is programmed to:
    determine that a single cell value of each data-storing cell in the first memory portion is the same as the digital value of the first level of the respective cell when the digital values of the first and second levels are different; and
    determine that a single cell value of each data-storing cell in the first memory portion is the same as the digital value of the second level of the respective cell when the digital values of the first and second levels are different.

7. A system in accordance with claim 1, wherein said processor is programmed to:
    determine a cell value of "0" if the first and second levels of the cell comprise a "00" or a "01" combination; and
    determine a cell value of "1" if the first and second levels of the cell comprise a "10" or a "11" combination.

8. A system in accordance with claim 1, wherein said processor is further programmed to write in the second memory portion a first digital value into a first level of each data-storing cell in the first memory portion and to write a second digital value into a second level of each data-storing cell wherein the first and second digital values are independent of each other, said processor programmed to read a digital value from each level of each data-storing cell in the first memory portion.

9. A system in accordance with claim 1, wherein said processor is programmed to determine a single cell value of each data-storing cell in the first memory portion that is the same as the digital value of the first and second level when the digital values are the same.

10. A system in accordance with claim 1, wherein said processor is programmed to:
    determine that a single cell value of each data-storing cell in the first memory portion is the same as the digital value of the first level of the respective cell when the digital values of the first and second levels are different; and
    determine that a single cell value of each data-storing cell in the first memory portion is the same as the digital value of the second level of the respective cell when the digital values of the first and second levels are different.

11. A method of managing data in a Crash Protected Memory (CPM) system comprising:
    writing using a processor a first digital value into a first level of each data-storing cell in a first memory portion of a Multi-Level Cell (MLC) memory module;
    writing using the processor a second digital value into a second level of each data-storing cell in the first memory portion wherein the first and second digital values are the same;
    reading a digital value from each level of each data-storing cell in the first memory portion;
    determining a single digital cell value for each data-storing cell based on the read digital values from each level of a respective data-storing cell; and
    outputting the determined value.

12. A method in accordance with claim 11, further comprising:
    determining a cell value of "0" if the first and second levels of the cell comprise a "00" or a "01" combination; and
    determining a cell value of "1" if the first and second levels of the cell comprise a "10" or a "11" combination.

13. A non-transient computer readable medium encoded with a program configured to instruct one or more computers to:
    write in a first memory portion of a Multi-Level Cell (MLC) memory module a first digital value into a first level of each data-storing cell in the first memory portion;
    write a second digital value into a second level of each data-storing cell wherein the first and second digital values are the same; and
    read a digital value from each level of each data-storing cell in the first memory portion and determine a single digital cell value for each data-storing cell based on the first and second digital values.

14. A medium in accordance with claim 13, wherein said MLC memory module comprises a second memory portion and wherein said program is configured to instruct one or more computers to write in the second memory portion a first digital value into a first level of each data-storing cell in the first memory portion and to write a second digital value into a second level of each data-storing cell wherein the first and second digital values are independent of each other, said program is configured to instruct one or more computers to read a digital value from each level of each data-storing cell in the first memory portion.

15. A medium in accordance with claim 13, wherein said program configured to instruct one or more computers to determine a single cell value of each data-storing cell in the first memory portion that is the same as the digital value of the first and second level when the digital values are the same.

16. A medium in accordance with claim 13, wherein said program is configured to instruct one or more computers to:
    determine that a single cell value of each data-storing cell in the first memory portion is the same as the digital value of the first level of the respective cell when the digital values of the first and second levels are different; and
    determine that a single cell value of each data-storing cell in the first memory portion is the same as the digital value of the second level of the respective cell when the digital values of the first and second levels are different.

17. A medium in accordance with claim 13, wherein said program is configured to instruct one or more computers to:
    determine a cell value of "0" if the first and second levels of the cell comprise a "00" or a "01" combination; and
    determine a cell value of "1" if the first and second levels of the cell comprise a "10" or a "11" combination.

18. A medium in accordance with claim 13, wherein said program is configured to instruct one or more computers to write in the second memory portion a first digital value into a first level of each data-storing cell in the first memory portion and to write a second digital value into a second level of each data-storing cell wherein the first and second digital values are independent of each other, said processor programmed to read a digital value from each level of each data-storing cell in the first memory portion.

19. A medium in accordance with claim 13, wherein said program is configured to instruct one or more computers to determine a single cell value of each data-storing cell in the first memory portion that is the same as the digital value of the first and second level when the digital values are the same.

20. A medium in accordance with claim 13, wherein said program is configured to instruct one or more computers to:
    determine that a single cell value of each data-storing cell in the first memory portion is the same as the digital value of the first level of the respective cell when the digital values of the first and second levels are different; and
    determine that a single cell value of each data-storing cell in the first memory portion is the same as the digital value of the second level of the respective cell when the digital values of the first and second levels are different.

* * * * *